United States Patent [19]
Imashiro et al.

[11] Patent Number: 6,103,836
[45] Date of Patent: Aug. 15, 2000

[54] EPOXY RESIN COMPOSITION

[75] Inventors: Yasuo Imashiro; Takahiko Ito; Hideshi Tomita; Norimasa Nakamura, all of Tokyo, Japan

[73] Assignee: Nisshinbo Industries, Inc., Tokyo, Japan

[21] Appl. No.: 09/311,721

[22] Filed: May 14, 1999

[30] Foreign Application Priority Data

May 15, 1998 [JP] Japan ................................. 10-133450

[51] Int. Cl.[7] ............................. C08L 63/02; C08L 63/04
[52] U.S. Cl. ........................................... 525/452; 525/453
[58] Field of Search ............................................. 525/452

[56] References Cited

U.S. PATENT DOCUMENTS 5,576,398  11/1996  Takahashi et al. ...................... 525/528

*Primary Examiner*—Ana Woodward
*Attorney, Agent, or Firm*—Kubovcik & Kubovcik

[57] ABSTRACT

An epoxy resin composition comprising
(1) an epoxy resin,
(2) a polymer obtained by reacting a polycarbodiimide with a compound having, in the molecule, at least one group reactive with carbodiimide group, between the carbodiimide group of said polycarbodiimide and the group reactive with carbodiimide group, of said compound, and
(3) a curing agent for epoxy resin.

The above epoxy resin composition alleviates the problems of the prior art; has a long pot life in a solution state, has an appropriate gelling time and accordingly good workability, is superior in film formability and handleability in B-stage, and has high heat resistance after curing; therefore, is suitably used in printed wiring board, prepreg, etc.

5 Claims, No Drawings

EPOXY RESIN COMPOSITION

BACKGROUND OF THE INVENTION

1. Field of the Invention

The present invention relates to an epoxy resin composition. More particularly, the present invention relates to an epoxy resin composition which is superior in storage stability, workability, heat resistance and film formability in B-stage, and accordingly used suitably in printed wiring board, prepreg, etc.; as well as to a prepreg or a metal foil having a resin film thereon, both produced using the composition.

2. Description of the Prior Art

In recent years, electric or electronic appliances have become lighter and thinner. For example, printed wiring boards have come to employ higher-density mounting, and various processes for production of such a printed wiring board have been developed. In particular, the process for producing a multi-layered printed wiring board using a metal foil having a resin film thereon is expected to become more popular for the convenience.

The outline of the process for producing a multi-layered printed wiring board using a metal foil having a resin film thereon is as follows. First, on the surface of an inner-layer substrate on which a circuit pattern has been formed, is placed a metal foil having thereon a resin film formed by coating an insulating resin (mainly epoxy resin) varnish and then converting the varnish into a B-stage; then, on the outer-layer metal foil is formed a circuit pattern; thereon is placed a different metal foil having a resin film of B-stage; as necessary, electric conduction is achieved between the circuit layers. By employing such a production process, it has become possible to produce a printed wiring board of high density and lightweightness.

In the midst of technical developments associated with the above-mentioned movement of electric or electronic appliances into smaller weight and smaller thickness, severe requirements are being demanded also for the insulating resins used in parts of electric or electronic appliances such as printed wiring board and the like. However, no insulating resin satisfying such severe requirements has been developed yet. That is, for example, the B-stage resin of a metal film having a B-stage resin film thereon has problems of, for example, cracking or peeling when an external force is applied thereto in winding-up by roll, etc., or scattering of resin powder when cut. Any of these problems leads to reduction in reliability of printed wiring board and must be solved.

Copper-clad laminated boards used in production of printed wiring board are produced, for example, by impregnating a substrate (e.g. glass cloth) with an insulating resin (e.g. epoxy resin) varnish, converting the varnish into a B-stage to form a prepreg, laminating a required number of such prepregs, laminating thereon a metal foil (e.g. copper foil), and subjecting the resulting material to molding under heat and pressure. In this case, there has been a problem in that the B-stage prepreg has poor handleability in the molding under heat and pressure, owing to the properties of the insulating resin (e.g. epoxy resin) and that when an external force is applied to the prepreg, there occurs the cracking or peeling of the resin.

Moreover, the resin used as an insulating resin in parts, etc. of electric or electronic appliances has insufficient heat resistance, and improvement of the heat resistance thereof has been an urgent task.

In order to solve the above problem of poor handleability in the B-stage, it has been conducted to, for example, add a resin of large epoxy equivalent to the main component resin (a resin of small epoxy equivalent). With this approach, the handleability in the B-stage is improved slightly but reduction in heat resistance is invited. In order to obtain increased heat resistance, it was also attempted to, for example, add a polyfunctional epoxy resin to the main component resin; with this approach, however, the handleability in the B-stage is inferior.

Meanwhile, addition of a polycarbodiimide (heat-resistant polymer) to an epoxy resin was proposed in order to increase the heat resistance of the epoxy resin. Application of the resulting material to a heat-resistant adhesive or the like is expected. This material, however, has a problem in that when the material is used in combination with an amine type curing agent for epoxy resin, a shorter pot life is invited.

In JP-A-9-241353 is disclosed a polycarbodiimide which was grafted and modified with trimellitic acid anhydride (a curing agent for epoxy resin). In order for an epoxy resin composition containing the above polycarbodiimide to exhibit good properties, a high curing temperature must be used; moreover, the epoxy resin composition is insufficient in gelling time of resin and a longer gelling time is required.

SUMMARY OF THE INVENTION

In view of the above problems of the prior art, the present invention has an object of providing an epoxy resin composition which has a long pot life in a solution state, has an appropriate gelling time and accordingly good workability, is superior in film formability and handleability in the B-stage, and has high heat resistance after curing.

The present inventors found out that a polymer obtained by reacting a polycarbodiimide with a compound having, in the molecule, at least one group reactive with a carbodiimide group, between the carbodiimide group of the polycarbodiimide and the at least one group of the compound, for example, a phenol-modified polycarbodiimide obtained by reacting a polycarbodiimide with a compound having a phenolic hydroxyl group, or an amide-modified polycarbodiimide obtained by reacting a polycarbodiimide with a compound having, in the molecule, at least one amide group, is stable at around room temperature but, when the polymer is heated, there occurs the dissociation of the compound having a phenolic hydroxyl group or the compound having at least one amide group, regenerating carbodiimide group. The present inventors further found out that by using the above polymer, there can be obtained an epoxy resin composition superior in storage stability, film formability in B-stage, and heat resistance. The present invention has been completed based on these findings.

According to the present invention, there is provided an epoxy resin composition comprising (1) an epoxy resin, (2) a polymer obtained by reacting a polycarbodiimide with a compound having, in the molecule, at least one group reactive with a carbodiimide group, between the carbodiimide group of said polycarbodiimide and the group reactive with carbodiimide group, of said compound, and (3) a curing agent for epoxy resin.

DETAILED DESCRIPTION OF THE INVENTION

The present invention is hereinafter described in detail.

As the epoxy resin used in the present invention, there can be mentioned epoxy resins having at least one epoxy group in the molecule, for example, glycidyl ether type epoxy resins (typified by bisphenol A type epoxy resin, novolac type epoxy resin, cresol novolac type epoxy resin, etc.), alicyclic epoxy resins, glycidyl ester type epoxy resins, heterocyclic epoxy resins and liquid rubber-modified epoxy resins. These epoxy resins can be used singly or in admixture thereof. The epoxy resin used in the present invention is not restricted thereto, and can be any epoxy resin known generally.

In the present invention, the carbodiimide resin to be reacted with a compound having, in the molecule, at least one group reactive with carbodiimide group can be produced by various processes, for example, a process disclosed in JP-A-51-20 61599, a process by L. M. Alberin et al. (J. Appl. Polym. Sci., 21, p. 1999 (1977) and a process disclosed in JP-A-2-292316. The carbodiimide resin can be produced from an organic polyisocyanate, preferably an aromatic polyisocyanate in the presence of a catalyst capable of promoting the carbodiimidization of isocyanate.

As the organic polyisocyanate, there can be mentioned, for example, 2,4-tolylene diisocyanate, 2,6-tolylene diisocyanate, a mixture of 2,4-tolylene diisocyanate and 2,6-tolylene diisocyanate, crude tolylene diisocyanate, crude methylenediphenyl diisocyanate, 4,4',4"-triphenylmethylene triisocyanate, xylylene diisocyanate, m-phenylene diisocyanate, naphthylene-1,5-diisocyanate, 4,4'-biphenylenediisocyanate, diphenylmethane-4,4'-diisocyanate, 3,3'-dimethoxybiphenyl diisocyanate, 3,3'-dimethyldiphenylmethane-4,4'-diisocyanate, and mixtures thereof.

The polycarbodiimide resin may have a controlled molecular weight, for example, by stopping, in a certain stage of the production, polycondensation by using at least one monoisocyanate.

The monoisocyanate used for blocking of the terminal of a polycarbodiimide to control its molecular weight can be exemplified by phenyl isocyanate, (o, m, or p)-tolyl isocyanate, dimethylphenyl isocyanate, cyclohexyl isocyanate and methyl isocyanate.

As is easily inferred, the terminal-blocking agent may also be a compound having —OH group, —NH$_2$ group, —COOH group, —SH group or —NH alkyl terminal.

As the catalyst for promoting the carbodiimidization of isocyanate, various compounds can be used and there is no particular restriction. However, 1-phenyl-2-phosphorene-1-oxide, 3-methyl-2-phosphorene-1-oxide, 3-phosphorene isomers thereof, etc. are suitable in view of the yield of polycarbodiimide resin, etc.

In the present invention, synthesis of the polycarbodiimide can be conducted in the presence or absence of a solvent. The solvent can be any solvent as long as it is inactive in the carbodiimidization reaction and can dissolve the polymer formed.

The solvent can be exemplified by aromatic hydrocarbons such as benzene, toluene, xylene, ethylbenzene and the like; halogenated hydrocarbons such as chlorobenzene, dichlorobenzene, trichlorobenzene, Perclene, trichloroethane, dichloroethane and the like; alicyclic ethers such as tetrahydrofuran, dioxane and the like; ketone compounds such as methyl ethyl ketone, methyl isobutyl ketone, cyclohexanone and the like; and amide compounds such as formamide, N,N-dimethylfor mamide, acetamide, N,N-dimethylacetamide, N-methyl-2-pyrrolidone and the like.

Of these solvents, particularly preferred are toluene, xylene, cyclohexanone, N,N-dimethylformamide, etc. each having a boiling point of 100 to 160° C. These solvents can be used singly or in admixture of two or more kinds.

When synthesis of a polycarbodiimide is conducted in a solvent, the polymer concentration is preferably 10 to 70% by weight, more preferably 30 to 50% by weight. When the concentration is not higher than 70% by weight, the possibility of gelling of polycarbodiimide during synthesis is low. When the concentration is not lower than 10% by weight, the time required for synthesis of a polycarbodiimide is not so long and no large energy is required for the solvent removal by distillation conducted in a later step (for example, a step of conversion into B-stage).

The reaction temperature used in the synthesis of a polycarbodiimide is determined depending upon the kinds of organic polyisocyanate and solvent used, but is ordinarily 30 to 200° C.

The average polymerization degree (n) of the polycarbodiimide used in the present invention is 3 to 200, preferably 5 to 100. When n is 3 or larger, the polycarbodiimide has an appropriate molecular weight and, accordingly, good film formability is exhibited in the B-stage. When n is 200 or smaller, the possibility of gelling of polycarbodiimide during synthesis is low and no long time is required for the reaction conducted later with a compound having, in the molecule, at least one group reactive with a carbodiimide group.

Incidentally, the average polymerization degree "n" referred to in this specification is calculated using the molar ratio of organic diisocyanate (which is a raw material used in the polycarbodiimide synthesis) and terminal-blocking agent (e.g. monoisocyanate) and is defined by the following formula.

$$n=2\times(\text{moles of diisocyanate/moles of terminal-blocking agent})$$

Incidentally, the average polymerization degree n when no terminal-blocking agent is used, can be determined by reacting the terminal isocyanate group of polycarbodiimide with a certain amine, then determining the amount of the reacted amine by titration, determining the amount of the terminal isocyanate group of a polycarbodiimide from the amount of the reacted amine, and calculating, from the amount of the terminal isocyanate group, the average polymerization degree n of a polycarbodiimide.

The compound having, in the molecule, at least one group reactive with carbodiimide group, to be reacted with the above-mentioned polycarbodiimide is, as an example, a compound having, in the molecule, at least one phenolic hydroxyl group (the compound is hereinafter referred to as "phenolic hydroxyl group-containing compound"). This compound has, in the molecule, at least one phenolic hydroxyl group but has neither active hydrogen other than the phenolic hydroxyl group nor carbon-to-carbon unsaturated bond other than the carbon-to-carbon unsaturated bond constituting any aromatic ring. The "active hydrogen" referred to herein is hydrogen directly bonding to oxygen or nitrogen.

Examples of such a compound are phenol, o-cresol, m-cresol, p-cresol, 2,3-dimethylphenol, 2,5-dimethylphenol, 2,3,6-trimethylphenol, 2,4,6-trimethylphenol, 3,4,5-trimethylphenol, 2-ethylphenol, 3-ethylphenol, 4-ethylphenol, 2-propylphenol, 4-propylphenol, 2-butylphenol, 3-butylphenol, 4-butylphenol, 2-methoxyphenol, 3-methoxyphenol, 4-methoxyphenol, 2-ethoxyphenol, 4-ethoxyphenol, 2-cyanophenol, 3-cyanophenol, 4-cyanophenol, catechol, hydroquoinone, 3-methylcatechol, 4-methylcatechol, me-thylhydroquinone, 2-butylhydroquinone, fluoroglycinol, 4,4'-iso-propylidenediphenol (bisphenol A), bis(2-hydroxyphenyl)methane, bis(4-hydroxyphenyl)methane and phenolic resins [e.g. Resitop (trade name), a product of Gunei Chemical Industry Co., Ltd.]. These compounds can be used singly or in admixture of two or more kinds.

Of these compounds having at least one phenolic hydroxyl group, preferred is a compound represented by the following general formula (1):

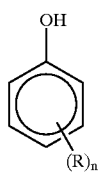

(1)

in view of the heat resistance of the present epoxy resin composition.

In the above formula (1), n is an O or integer of 1 to 5; and R is a lower alkyl group or a lower alkoxy group and, when n is 2 or more, a plurality of R's may be the same or different. As such a compound, there can be mentioned some of the compounds mentioned above, that is, phenol, o-cresol, m-cresol, p-cresol, 2,3-dimethylphenol, 2,5-dimethylphenol, 2,3,6-trimethylphenol, 2,4,6-trimethylphenol, 3,4,5-trimethylphenol, 2-ethylphenol, 3-ethylphenol, 4-ethylphenol, 2-propylphenol, 4-propylphenol, 2-butylphenol, 3-butylphenol, 4-butylphenol, 2-methoxyphenol, 3-methoxyphenol, 4-methoxyphenol, 2-ethoxyphenol and 4-ethoxyphenol.

The compound having, in the molecule, at least one group reactive with a carbodiimide group, to be reacted with the above-mentioned polycarbodiimide is, as another example, a compound having, in the molecule, at least one amide group (the compound is hereinafter referred to as "amide group-containing compound"). This compound has, in the molecule, at least one amide group (CONH) but has no active hydrogen other than the amide group. The "active hydrogen" referred to herein is hydrogen directly bonding to oxygen or nitrogen.

Examples of such a compound having at least one amide group are methylacetamide, ethylacetamide, benzamide, N-methylacrylamide, N-ethylacrylamide, N-allylacrylamide, N-phenylacrylamide, ε-caprolactam and δ-valerolactam. Of these, ε-caprolactam and δ-valerolactam, in particular, are economical for the short reaction time, and ε-caprolactam is particularly preferred because of the low cost, etc.

As to the use amounts of (a) the polycarbodiimide and (b) the compound having at least one phenolic hydroxyl group or the compound having at least one amide group, there can be mentioned, for example, 10:1 to 10:50, preferably 10:8 to 10:15 in terms of the equivalent ratio between the carbodiimide group of the polycarbodiimide (a) and the phenolic hydroxyl group or amide group of the compound (b). When the equivalents of the phenolic hydroxyl group or amide group of the compound (b) are 1 or more per 10 equivalents of the carbodiimide group of the polycarbodiimide (a), the carbodiimide group exists in an appropriate amount and good storage stability is obtained. When the equivalents of the phenolic hydroxyl group or amide group of the compound (b) are 50 or less, there is no fear of impairment of heat resistance after curing.

In the reaction between the carbodiimide group of the polycarbodiimide (a) with the phenolic hydroxyl group or amide group of the compound (b), the compound (b) may be mixed with the polycarbodiimide (a) as it is or after having been dissolved in or diluted with an appropriate solvent. Alternatively, the polycarbodiimide (a) may be added to the compound (b) having at least one hydroxyl group or at least one amide group.

The solvent used in the above reaction is preferably such that does not impair the reaction and that can dissolve both the starting materials and the reaction product. The solvent may be, for example, the same solvent as used in the synthesis of the polycarbodiimide, or may be different therefrom. The amount of the solvent used can be such that the concentration of the final product becomes 5 to 70% by weight, preferably 20 to 50% by weight.

The reaction temperature employed in the above reaction is 20 to 160° C., preferably 50 to 140° C. When the reaction temperature is 20° C. or higher, an appropriate reaction rate is obtained. When the reaction temperature is 160° C. or lower, there is no regeneration of carbodiimide group and no long time is required for completion of the reaction. Incidentally, it is possible to use, in the reaction, a known catalyst for promoting the reaction, such as alkali metal alcoholate, organotin compound, organozinc compound or the like.

The polymer obtained by the reaction of the carbodiimide group of the polycarbodiimide (a) with the phenolic hydroxyl group of the compound (b) (the polymer is hereinafter referred to as "phenol-modified polycarbodiimide"), or the polymer obtained by the reaction of the carbodiimide group of the polycarbodiimide (a) with the amide group of the compound (b) (the polymer is hereinafter referred to as "amide-modified polycarbodiimide") may be isolated or need not be isolated. When the polymer is isolated, the isolation is conducted by adding, to the polymer solution (e.g. toluene solution), an aliphatic hydrocarbon (e.g. n-hexane) which is a poor solvent to the polymer, to precipitate the polymer.

As the curing agent for epoxy resin, used in the present invention, there can be mentioned polyamines (alicyclic polyamines, aromatic polyamines and modified polyamines), acid anhydrides, polyphenols, polymercaptans, etc. all generally known as a curing agent for epoxy resin. They can be used singly or in admixture of two or more kinds.

As specific examples of the curing agent for epoxy resin, there can be mentioned diethylenetriamine, triethylenetetramine, tetraethylenepentamine, triethylenediamine, isophoronediamine, N-aminoethylpiperazine, 3,9-bis(3-aminopropyl)-2,4,8,10-tetraoxyspiro-(5,5')-undecane adduct, dicyandiamide, diaminodiphenylsulfone, phenylenediamine, phthalic anhydride, tetrahydrophthalic anhydride, methylnadic anhydride, pyromellitic anhydride, phenolic novolac, polymercaptan and 2-ethyl-4-methylimidazole.

As mentioned above, the epoxy resin composition of the present invention comprises
  (1) an epoxy resin,
  (2) a polymer obtained by reacting a polycarbodiimide with a compound having, in the molecule, at least one group reactive with carbodiimide group, between the carbodiimide group of said polycarbodiimide and the group reactive with carbodiimide group, of said compound, and (3) a curing agent for epoxy resin.

The amounts of the individual components used in the composition are as follows.

The polymer obtained by reacting a polycarbodiimide with a compound having, in the molecule, at least one group reactive with carbodiimide group, between the carbodiimide group of said polycarbodiimide and the group reactive with carbodiimide group of said compound, is used in an amount of 1 to 500 parts by weight, preferably 5 to 100 parts by weight, more preferably 10 to 30 parts by weight per 100 parts by weight of the epoxy resin. When the polymer is used in an amount of 1 part by weight or more, the effects of film formability and heat resistance are obtained. When the polymer is used in an amount of more than 500 parts by weight, the properties of the epoxy resin may be impaired.

The curing agent for epoxy resin is used in an amount of preferably 0.1 to 1.2 equivalents, more preferably 0.5 to 1.0 equivalent per equivalent of the epoxy resin. When the curing agent for epoxy resin is used in an amount of 0.1 equivalent or more, a cured material of good properties can be obtained. When the curing agent is used in an amount of 1.2 equivalents or less, the cured material shows no reduction in heat resistance or the like.

In the present invention, there can be used, in combination with the curing agent for epoxy resin, a curing-coagent such as imidazole (e.g. 2-methylimidazole, 2-ethyl-4-methylimidazole, 2-undecylimidazole or 1-cyanoethyl-2-methylimi-dazole), tertiary amine or the like. The amount of the curing-coagent used is preferably 0.1 to 5 parts by weight per 100 parts by weight of the epoxy resin. The curing agent and/or the curing-coagent may be added to the epoxy resin as they (it) are (is) or by dissolving them (it) in an appropriate solvent.

In the present invention, there can also be used, as necessary, an inorganic filler (e.g. talc, clay, mica, silica, zeolite or graphite) and a liquid rubber (e.g. CTBN or ATBN produced by Ube Industries, Ltd.). The inorganic filler is effective for reducing the thermal expansion coefficient of cured material, and the liquid rubber is effective for enhancing the flexibility of a resin film in the B-stage. The inorganic filler and the liquid rubber can be used in such amounts that the other properties of the present epoxy resin composition are not impaired.

There is no particular restriction as to the method for mixing the epoxy resin, the polymer obtained by reacting a polycarbodiimide with a compound having, in the molecule, at least one group reactive with carbodiimide group, the curing agent for epoxy resin, and the other components used as necessary. The three essential components may be mixed simultaneously, or it is possible to first mix two of them and then mix the remaining one component with the resulting mixture. When any of the three essential components and the other components is a solid, it is possible to dissolve the solid in an appropriate solvent and mix the resulting solution with other liquid components.

The polymer obtained by reacting a polycarbodiimide with a compound having, in the molecule, at least one group reactive with carbodiimide group may be used in combination of a plurality of such polymers, for example, a phenol-modified polycarbodiimide and an amide-modified polycarbodiimide.

When the above-mentioned three essential components are mixed, it is possible to heat them to, for example, 40 to 60° C. as necessary so that no curing takes place. In this case, the above-mentioned curing-coagent and additives may be added.

The thus-obtained epoxy resin composition of the present invention has excellent storage stability because the content of carbodiimide group (which causes gelling) is low in one of the essential components, i.e. the polymer obtained by reacting a polycarbodiimide with a compound having, in the molecule, at least one group reactive with carbodiimide group, for example, the phenol-modified polycarbodiimide or the amide-modified polycarbodiimide. Further, the present epoxy resin composition has high film formability because said polymer has good film formability. Furthermore, the present epoxy resin composition can exhibit the excellent heat resistance of polycarbodiimide because carbodiimide group is regenerated by heating.

The epoxy resin composition of the present invention can be used in, for example, a prepreg or a metal foil having a resin film thereon, both used in production of multi-layered printed wiring board. The prepreg is obtained generally by impregnating a glass cloth with a resin and then drying the impregnated glass cloth. As the substrate other than glass cloth, there are known paper, organic fiber cloth, carbon cloth, glass unwoven cloth, etc. In the present invention, any substrate may be used.

There is no particular restriction as to the method for resin coating or resin impregnation and the drying method. For example, the drying conditions can be appropriately determined depending upon the boiling point of the solvent used. Use of too high a temperature in drying is not preferred. One prepreg or a plurality of prepregs are laminated, the resulting laminate is heat-pressed to obtain a laminated board; or, a metal foil is laminated on the outermost layer of the laminated board to obtain a multi-layered printed wiring board.

Meanwhile, the metal foil having a resin film thereon has come to be widely used, in recent years, in the production of a multi-layered printed wiring board. As to the kind of the metal foil, a nickel foil or a copper foil is known. Any other metal foil may also be used. Since a copper foil is most generally used in production of printed wiring boards because of the cost and performance, it is preferred to use a copper foil as well in the present invention. By coating such a metal foil with the epoxy resin composition of the present invention and converting the composition to a B-stage, a metal foil with a highly flexible resin film can be obtained.

The present invention is described in more detail below by way of Examples. However, the present invention is in no way restricted thereby.

SYNTHESIS OF ISOUREA BOND-CONTAINING POLYMERS

SYNTHESIS EXAMPLE 1

Into a four-necked 1-liter flask provided with a cooling tube were fed 200 g of tolylene diisocyanate (TDI), 20.0 g of phenyl isocyanate, 248 g of cyclohexanone and 0.44 g of 3-methyl-1-phenyl-2-phosphorene-1-oxide. A reaction was conducted at 100° C. for 4.5 hours to obtain an orange-colored transparent varnish of polycarbodiimide [Mn=2.1× $10^3$, Mn is a number-average molecular weight obtained by GPC and is a polystyrene-reduced value (the same applies hereinafter)]. Thereto was added 160 g of m-cresol diluted with 170 g of cyclohexanone, at 130° C. with stirring. A reaction was conducted at 130° C. for 2 hours, then at 100° C. for 2 hours, and lastly at 50° C. for 8 hours to obtain a reddish brown transparent varnish of polymer (Mn=3.5× $10^3$). The varnish was measured for IR spectrum. There was substantially no absorption of carbodiimide group at 2,137 $cm^{-1}$, and an absorption attributed to isourea was observed at 1,667 $cm^{-1}$. This varnish is named as varnish 1.

SYNTHESIS EXAMPLE 2

Into a four-necked 1-liter flask provided with a cooling tube were fed 200 g of TDI, 7.0 g of phenyl isocyanate, 360 g of cyclohexanone and 0.42 g of 3-methyl-1-phenyl-2-phosphorene-1-oxide. A reaction was conducted at 100° C. for 5 hours to obtain an orange-colored transparent varnish of polycarbodiimide ($Mn=5.2\times10^3$). Thereto was added 46.3 g of p-cresol diluted with 108 g of cyclohexanone, at 1300 with stirring. A reaction was conducted at 130° C. for 2 hours, at 100° C. for 3 hours, at 70° C. for 5 hours, and at 40° C. for 5 hours in this order to obtain a reddish brown transparent varnish of polymer ($Mn=9.0\times10^3$). The varnish was measured for IR spectrum. There was substantially no absorption of carbodiimide group at 2,137 $cm^{-1}$, and an absorption attributed to isourea was observed at 1,667 $cm^{-1}$. This varnish is named as varnish 2.

SYNTHESIS EXAMPLE 3

Into a four-necked 1-liter flask provided with a cooling tube were fed 90 g of TDI, 1.24 g of phenyl isocyanate, 612 g of cyclohexanone and 0.18 g of 3-methyl-1-phenyl-2-phosphorene-1-oxide. A reaction was conducted at 100° C. for 8 hours to obtain an orange-colored transparent varnish of polycarbodiimide ($Mn=1.2\times10^4$). Thereto were added 85 g of m-cresol and 0.1 g of sodium methoxide dissolved in methanol. A reaction was conducted at 100° C. for 30 hours and then at 60° C. for 10 hours to obtain a reddish brown transparent varnish of polymer ($Mn=2.1\times10^4$). The varnish was measured for IR spectrum. There was substantially no absorption of carbodiimide group at 2,137 $cm^{-1}$, and an absorption attributed to isourea was observed at 1,668 $cm^{-1}$. This varnish is named as varnish 3.

SYNTHESIS EXAMPLE 4

Into a four-necked 1-liter flask provided with a cooling tube were fed 200 g of TDI, 54.7 g of phenyl isocyanate, 291 g of toluene and 0.51 g of 3-methyl-1-phenyl-2-phosphorene-1-oxide. A reaction was conducted at 90° C. for 4 hours to obtain a yellow transparent varnish of polycarbodiimide ($Mn=7.2\times10^2$). Thereto was added 194 g of phenol dissolved in 130 g of toluene. A reaction was conducted under refluxing with toluene for 3 hours, then at 100° C. for 6 hours, and lastly at 60° C. for 6 hours to obtain a yellow transparent varnish of polymer ($Mn=1.2\times10^3$). The varnish was measured for IR spectrum. There was substantially no absorption of carbodiimide group at 2,137 $cm^{-1}$, and an absorption attributed to isourea was observed at 1,668 $cm^{-1}$. This varnish is named as varnish 4.

SYNTHESIS EXAMPLE 5

Into a four-necked 1-liter flask provided with a cooling tube were fed 120 g of TDI, 12.0 g of phenyl isocyanate, 150 g of cyclohexanone and 0.26 g of 3-methyl-1-phenyl-2-phosphorene-1-oxide. A reaction was conducted at 100° C. for 4.5 hours to obtain an orange-colored transparent varnish of polycarbodiimide ($Mn=2.0\times10^3$). Thereto was added 140 g of p-methoxyphenol dissolved in 300 g of cyclohexanone. A reaction was conducted at 130° C. for 3 hours, at 90° C. for 8 hours and at 60° C. for 4 hours in this order to obtain a reddish brown transparent varnish of polymer ($Mn=3.5\times10^3$). The varnish was measured for IR spectrum. There was substantially no absorption of carbodiimide group at 2,137 $cm^{-1}$, and an absorption attributed to isourea was observed at 1,666 $cm^{-1}$. This varnish is named as varnish 5.

SYNTHESIS EXAMPLE 6

Into a four-necked 1-liter flask provided with a cooling tube were fed 100 g of TDI, 10.0 g of phenyl isocyanate, 124 g of cyclohexanone and 0.22 g of 3-methyl-1-phenyl-2-phosphorene-1-oxide. A reaction was conducted at 100° C. for 5 hours to obtain an orange-colored transparent varnish of polycarbodiimide ($Mn=2.1\times10^3$). Thereto were added 178 g of bisphenol A dissolved in 500 g of cyclohexanone and a solution of 0.33 g of sodium methoxide dissolved in methanol. A reaction was conducted at 100° C. for 3 hours and then at 60° C. for 4 hours to obtain a reddish brown transparent varnish of polymer ($Mn=4.3\times10^3$). The varnish was measured for IR spectrum. There was substantially no absorption of carbodiimide group at 2,137 $cm^{-1}$, and an absorption attributed to isourea was observed at 1,667 $cm^{-1}$. This varnish is named as varnish 6.

SYNTHESIS EXAMPLE 7

Into a four-necked 1-liter flask provided with a cooling tube were fed 50 g of TDI, 13.7 g of phenyl isocyanate, 73 g of cyclohexanone and 0.13 g of 3-methyl-1-phenyl-2-phosphorene-1-oxide. A reaction was conducted at 90° C. for 4.5 hours to obtain an orange-colored transparent varnish of polycarbodiimide ($Mn=7.9\times10^2$). Thereto was added 146 g of a novolac type phenolic resin [Resitop PSM 4261 (trade name), a product of Gunei Chemical Industry Co., Ltd., OH equivalent=103] dissolved in 440 g of cyclohexanone. A reaction was conducted at 130° C. for 5 hours, then at 100° C. for 4 hours, and lastly at 60° C. for 4 hours to obtain a dark reddish brown transparent varnish of polymer ($Mn=2.9\times10^3$). The varnish was measured for IR spectrum. There was substantially no absorption of carbodiimide group at 2,137 $cm^{-1}$, and an absorption attributed to isourea was observed at 1,667 $cm^{-1}$. This varnish is named as varnish 7.

SYNTHESIS EXAMPLE 8

Into a four-necked 1-liter flask provided with a cooling tube were fed 50 g of 4,4'-diphenylmethanediisocyanate (MDI), 5.3 g of phenyl isocyanate, 182 g of cyclohexanone and 0.71 g of 3-methyl-1-phenyl-2-phosphorene-1-oxide. A reaction was conducted at 80° C. for 5 hours to obtain a light yellow varnish of polycarbodiimide ($Mn=1.8\times10^3$). Thereto were added 36.3 g of m-cresol dissolved in 70 g of cyclohexanone and a solution of 0.33 g of sodium methoxide dissolved in methanol. A reaction was conducted at 120° C. for 3 hours, then at 90° C. for 5 hours, and lastly at 60° C. for 5 hours to obtain a brown transparent varnish of polymer ($Mn=2.7\times10^3$). The varnish was measured for IR spectrum. There was substantially no absorption of carbodiimide group at 2,110 $cm^{-1}$, and an absorption attributed to isourea was observed at 1,667 $cm^{-1}$. This varnish is named as varnish 8.

SYNTHESIS OF AMIDE-MODIFIED POLYCARBODIIMIDES

SYNTHESIS EXAMPLE 9

Into a four-necked 1-liter flask provided with a cooling tube and a stirring motor were fed 87 g of TDI, 13.2 g of phenyl isocyanate, 177 g of toluene (a solvent) and 0.2 g of 3-methyl-1-phenyl-2-phosphorene-1-oxide. A reaction was conducted at 120° C. for 3.5 hours to obtain a yellow transparent varnish of polycarbodiimide ($Mn=1.5\times10^3$). Thereto were added 95 g of ε-caprolactam and 0.075 g of zinc 2-ethylhexanoate dissolved in 222 g of dimethylformamide (hereinafter referred to as DMF). A reaction was conducted at 1300 for 5 hours and then at 70° C. for 6 hours to obtain a reddish brown transparent varnish. The varnish was measured for IR spectrum. There was substantially no absorption of carbodiimide group at 2,137 $cm^{-1}$, and an absorption of the carbonyl group formed by a reaction of carbodiimide and amide was observed at 1,660 cm$^{-1}$. This varnish is named as varnish 9.

SYNTHESIS EXAMPLE 10

Into a four-necked 1-liter flask provided with a cooling tube and a stirring motor were fed 87 g of TDI, 2.43 g of phenyl isocyanate, 177 g of toluene and 0.18 g of 3-methyl-1-phenyl-2-phosphorene-1-oxide. A reaction was conducted at 120° C. for 4 hours to obtain a yellow transparent varnish of polycarbodiimide (Mn=5.4×10$^3$). Thereto were added 144 g of ε-caprolactam and 0.068 g of zinc 2-ethylhexanoate dissolved in 336 g of DMF. A reaction was conducted at 150° C. for 5 hours and then at 100° C. for 6 hours to obtain a reddish brown transparent varnish. The varnish was measured for IR spectrum. There was substantially no absorption of carbodiimide group at 2,137 cm$^{-1}$, and an absorption of the carbonyl group formed by a reaction of carbodiimide and amide was observed at 1,660 cm$^{-1}$. This varnish is named as varnish 10.

SYNTHESIS EXAMPLE 11

Into a four-necked 1-liter flask provided with a cooling tube and a stirring motor were fed 87 g of TDI, 13.2 g of phenyl isocyanate, 177 g of toluene and 0.2 g of 3-methyl-1-phenyl-2-phosphorene-1-oxide. A reaction was conducted at 120° C. for 3.5 hours to obtain a yellow transparent varnish of polycarbodiimide (Mn=1.5×10$^3$). Thereto were added 83 g of δ-valerolactam and 0.075 g of zinc 2-ethylhexanoate dissolved in 194 g of DMF. A reaction was conducted at 130° C. for 5 hours and then at 70° C. for 6 hours to obtain a reddish brown transparent varnish. The varnish was measured for IR spectrum. There was substantially no absorption of carbodiimide group at 2,137 cm$^{-1}$, and an absorption of the carbonyl group formed by a reaction of carbodiimide and amide was observed at 1,660 cm$^{-1}$. This varnish is named as varnish 11.

SYNTHESIS EXAMPLE 12

Into a four-necked 1-liter flask provided with a cooling tube and a stirring motor were fed 100 g of MDI, 10.6 g of phenyl isocyanate, 364 g of tetrahydrofuran (hereinafter referred to as THF) and 0.22 g of 3-methyl-1-phenyl-2-phosphorene-1-oxide. A reaction was conducted at 80° C. for 5 hours to obtain a light yellow varnish of polycarbodiimide (Mn=1.8×10$^3$). Thereto were added 76 g of ε-caprolactam and 0.09 g of zinc 2-ethylhexanoate dissolved in 178 g of DMF. A reaction was conducted at 130° C. for 5 hours, then at 100° C. for 4 hours, and lastly at 70° C. for 3 hours to obtain a reddish brown transparent varnish. The varnish was measured for IR spectrum. There was substantially no absorption of carbodiimide group at 2,110 cm$^{-1}$, and an absorption of the carbonyl group formed by a reaction of carbodiimide and amide was observed at 1,660 cm$^{-1}$. This varnish is named as varnish 12.

SYNTHESIS EXAMPLE 13 (VARNISH FOR COMPARATIVE EXAMPLE)

Into a four-necked 500-milliliter flask provided with a cooling tube and a stirring motor were fed 87 g of TDI, 13.2 g of phenyl isocyanate, 177 g of toluene and 0.2 g of 3-methyl-1-phenyl-2-phosphorene-1-oxide. A reaction was conducted at 120° C. for 3.5 hours to obtain a yellow transparent varnish of polycarbodiimide (Mn=1.5×10$^3$). This varnish is named as varnish 13.

SYNTHESIS EXAMPLE 14 (VARNISH FOR COMPARATIVE EXAMPLE)

Into a four-necked 1-liter flask provided with a cooling tube and a stirring motor were fed 100 g of MDI, 10.6 g of phenyl isocyanate, 364 g of THF and 0.22 g of 3-methyl-1-phenyl-2-phosphorene-1-oxide. A reaction was conducted at 80° C. for 5 hours to obtain a light yellow varnish of polycarbodiimide (Mn=1.8×10$^3$). This varnish is named as varnish 14.

SYNTHESIS EXAMPLE 15 (VARNISH FOR COMPARATIVE EXAMPLE)

Into a four-necked 500-milliliter flask provided with a cooling tube were fed 50 g of phenyl isocyanate, 95 g of cyclohexanone and 0.10 g of 3-methyl-1-phenyl-2-phosphorene-1-oxide. A reaction was conducted at 90° C. for 3 hours to obtain a brown transparent varnish of monocarbodiimide. Thereto was added 27 g of m-cresol diluted with 50 g of cyclohexanone. A reaction was conducted at 130° C. for 2 hours and then at 90° C. for 3 hours to obtain a brown transparent varnish. The varnish was measured for IR spectrum. There was substantially no absorption of carbodiimide group at 2,137 cm$^{-1}$, and an absorption attributed to isourea was observed at 1,667 cm$^{-1}$. This varnish is named as varnish 15.

SYNTHESIS EXAMPLE 16 (VARNISH FOR COMPARATIVE EXAMPLE)

Into a four-necked 500-milliliter flask provided with a cooling tube and a stirring motor were fed 50 g of phenyl isocyanate, 95 g of toluene and 0.18 g of 3-methyl-1-phenyl-2-phosphorene-1-oxide. A reaction was conducted at 90° C. for 3 hours to obtain a light yellow transparent varnish of monocarbodiimide. Thereto were added 28 g of ε-caprolactam and 0.05 g of zinc 2-ethylhexanoate dissolved in 50 g of DMF. A reaction was conducted at 120° C. for 4 hours and then at 70° C. for 4 hours to obtain a reddish brown transparent varnish. The varnish was measured for IR spectrum. There was substantially no absorption of carbodiimide group at 2,140 cm$^{-1}$, and an absorption of the carbonyl group formed by a reaction of carbodiimide and amide was observed at 1,660 cm$^{-1}$. This varnish is named as varnish 16.

EXAMPLES 1 TO 30 AND COMPARATIVE EXAMPLES 1 to 5

One of the varnishes obtained in the above Synthesis Examples, an epoxy resin(s), a curing agent(s) and a solvent were mixed in the formulation (weight %) shown in Table 1 or 2 to obtain a solution. Each solution was tested for storage stability, film formability in B-stage, gelling time of resin, and glass transition temperature (hereinafter referred to as Tg) of cured material according to the following test methods.

(Storage stability)

A solution having the formulation shown in Table 1 or 2 was stored at room temperature to visually observe whether or not insolubles were formed or gelling appeared.

(Film formability in B-stage)

A solution having the formulation shown in Table 1 or 2 was coated on a copper foil (YPG-18, a product of Nippon Denkai Ltd.) so as to give a film (resin) thickness of 60 to 80 μm. The resulting material was heat-treated for 1 to 3 minutes in a dryer of 170 to 190° C., and then observation was made on the tack of resin as well as on the cracking of resin when the material was bent by 180°.

(Gelling time of resin)

A solution having the formulation shown in Table 1 or 2 was tested for the gelling time of resin on a hot plate of 170° C., according to JIS C 6521.

(Tg of cured material)

A solution having the formulation shown in Table 1 or 2 was coated on an aluminum foil so as to give a film (resin) thickness of about 0.1 mm. The resulting material was heat-treated at 175° for 90 minutes. The material after heat treatment was immersed in a 5% aqueous sodium hydroxide solution to dissolve and remove the aluminum foil. The resulting cured material was washed with water and dried, and cut into a size of about 2.5 cm×0.5 cm×0.1 mm to use it as a test piece for Tg measurement.

The test piece was measured for elastic modulus from room temperature to 250° C. and temperature diffusion of tan δ by the use of Rheolograph Solid (a product of Toyo Seiki Seisaku-Sho Ltd.), and the peak top temperature of the tan δ was taken as the Tg of the test piece. Incidentally, the frequency used was 10 Hz and the temperature-elevation rate used was 5° C./min.

The results are shown in Table 3.

TABLE 1

| | Epikote 828 | ESCN-195XL | YDPN-638 | Varnish 1 | Varnish 2 | Varnish 3 | Varnish 4 | Varnish 5 | Varnish 6 | Varnish 7 | Varnish 8 | Varnish 9 | Varnish 10 | Varnish 11 | Varnish 12 |
|---|---|---|---|---|---|---|---|---|---|---|---|---|---|---|---|
| Example 1 | 100 | 0 | 0 | 15 | 0 | 0 | 0 | 0 | 0 | 0 | 0 | 0 | 0 | 0 | 0 |
| Example 2 | 100 | 0 | 0 | 30 | 0 | 0 | 0 | 0 | 0 | 0 | 0 | 0 | 0 | 0 | 0 |
| Example 3 | 100 | 0 | 0 | 60 | 0 | 0 | 0 | 0 | 0 | 0 | 0 | 0 | 0 | 0 | 0 |
| Example 4 | 100 | 0 | 0 | 0 | 15 | 0 | 0 | 0 | 0 | 0 | 0 | 0 | 0 | 0 | 0 |
| Example 5 | 100 | 0 | 0 | 0 | 30 | 0 | 0 | 0 | 0 | 0 | 0 | 0 | 0 | 0 | 0 |
| Example 6 | 100 | 0 | 0 | 0 | 0 | 15 | 0 | 0 | 0 | 0 | 0 | 0 | 0 | 0 | 0 |
| Example 7 | 100 | 0 | 0 | 0 | 0 | 30 | 0 | 0 | 0 | 0 | 0 | 0 | 0 | 0 | 0 |
| Example 8 | 100 | 0 | 0 | 0 | 0 | 0 | 15 | 0 | 0 | 0 | 0 | 0 | 0 | 0 | 0 |
| Example 9 | 100 | 0 | 0 | 0 | 0 | 0 | 30 | 0 | 0 | 0 | 0 | 0 | 0 | 0 | 0 |
| Example 10 | 100 | 0 | 0 | 0 | 0 | 0 | 0 | 15 | 0 | 0 | 0 | 0 | 0 | 0 | 0 |
| Example 11 | 100 | 0 | 0 | 0 | 0 | 0 | 0 | 30 | 0 | 0 | 0 | 0 | 0 | 0 | 0 |
| Example 12 | 100 | 0 | 0 | 0 | 0 | 0 | 0 | 0 | 15 | 0 | 0 | 0 | 0 | 0 | 0 |
| Example 13 | 100 | 0 | 0 | 0 | 0 | 0 | 0 | 0 | 30 | 0 | 0 | 0 | 0 | 0 | 0 |
| Example 14 | 100 | 0 | 0 | 0 | 0 | 0 | 0 | 0 | 0 | 15 | 0 | 0 | 0 | 0 | 0 |
| Example 15 | 100 | 0 | 0 | 0 | 0 | 0 | 0 | 0 | 0 | 30 | 0 | 0 | 0 | 0 | 0 |
| Example 16 | 100 | 0 | 0 | 0 | 0 | 0 | 0 | 0 | 0 | 0 | 15 | 0 | 0 | 0 | 0 |
| Example 17 | 100 | 0 | 0 | 0 | 0 | 0 | 0 | 0 | 0 | 0 | 30 | 0 | 0 | 0 | 0 |
| Example 18 | 50 | 50 | 0 | 15 | 0 | 0 | 0 | 0 | 0 | 0 | 0 | 0 | 0 | 0 | 0 |
| Example 19 | 50 | 50 | 0 | 30 | 0 | 0 | 0 | 0 | 0 | 0 | 0 | 0 | 0 | 0 | 0 |
| Example 20 | 50 | 50 | 0 | 0 | 30 | 0 | 0 | 0 | 0 | 0 | 0 | 0 | 0 | 0 | 0 |
| Example 21 | 50 | 50 | 0 | 0 | 0 | 30 | 0 | 0 | 0 | 0 | 0 | 0 | 0 | 0 | 0 |
| Example 22 | 30 | 70 | 0 | 15 | 0 | 0 | 0 | 0 | 0 | 0 | 0 | 0 | 0 | 0 | 0 |
| Example 23 | 100 | 0 | 0 | 0 | 0 | 0 | 0 | 0 | 0 | 0 | 0 | 15 | 0 | 0 | 0 |
| Example 24 | 100 | 0 | 0 | 0 | 0 | 0 | 0 | 0 | 0 | 0 | 0 | 30 | 0 | 0 | 0 |
| Example 25 | 100 | 0 | 0 | 0 | 0 | 0 | 0 | 0 | 0 | 0 | 0 | 50 | 0 | 0 | 0 |
| Example 26 | 50 | 0 | 50 | 0 | 0 | 0 | 0 | 0 | 0 | 0 | 0 | 30 | 0 | 0 | 0 |
| Example 27 | 100 | 0 | 0 | 0 | 0 | 0 | 0 | 0 | 0 | 0 | 0 | 0 | 30 | 0 | 0 |
| Example 28 | 100 | 0 | 0 | 0 | 0 | 0 | 0 | 0 | 0 | 0 | 0 | 0 | 0 | 30 | 0 |
| Example 29 | 100 | 0 | 0 | 0 | 0 | 0 | 0 | 0 | 0 | 0 | 0 | 0 | 0 | 0 | 30 |
| Example 30 | 100 | 0 | 0 | 0 | 0 | 0 | 0 | 0 | 0 | 0 | 0 | 0 | 0 | 0 | 50 |

TABLE 2

| | Epikote 828 | Dicyandiamide | Varnish 13 | Varnish 14 | Varnish 15 | Varnish 16 |
|---|---|---|---|---|---|---|
| Comparative Example 1 | 100 | 6.7 | 0 | 0 | 0 | 0 |
| Comparative Example 2 | 100 | 6.7 | 15 | 0 | 0 | 0 |
| Comparative Example 3 | 100 | 6.7 | 0 | 15 | 0 | 0 |
| Comparative Example 4 | 100 | 6.7 | 0 | 0 | 15 | 0 |
| Comparative Example 5 | 100 | 6.7 | 0 | 0 | 0 | 30 |

TABLE 3

| | Storage stability | Film formability | Gelling time (min) | Tg (° C.) |
|---|---|---|---|---|
| Example 1 | ○ | ○ | 4 | 172 |
| Example 2 | ○ | ○ | 3.5 | 194 |
| Example 3 | ○ | ○ | 3 | 221 |
| Example 4 | ○ | ○ | 4.5 | 180 |
| Example 5 | ○ | ○ | 4 | 194 |
| Example 6 | ○ | ○ | 4 | 175 |
| Example 7 | ○ | ○ | 3.5 | 190 |
| Example 8 | ○ | ○ | 4 | 183 |
| Example 9 | ○ | ○ | 4 | 191 |
| Example 10 | ○ | ○ | 4 | 170 |
| Example 11 | ○ | ○ | 3.5 | 185 |
| Example 12 | ○ | ○ | 4.5 | 168 |
| Example 13 | ○ | ○ | 4 | 171 |
| Example 14 | ○ | ○ | 4.5 | 166 |

TABLE 3-continued

|  | Storage stability | Film formability | Gelling time (min) | Tg (° C.) |
|---|---|---|---|---|
| Example 15 | ○ | ○ | 4 | 170 |
| Example 16 | ○ | ○ | 4 | 173 |
| Example 17 | ○ | ○ | 3.5 | 189 |
| Example 18 | ○ | ○ | 4 | 221 |
| Example 19 | ○ | ○ | 3.5 | 229 |
| Example 20 | ○ | ○ | 3.5 | 223 |
| Example 21 | ○ | ○ | 3.5 | 218 |
| Example 22 | ○ | ○ | 4 | 235 |
| Example 23 | ○ | ○ | 5 | 175 |
| Example 24 | ○ | ○ | 4.5 | 182 |
| Example 25 | ○ | ○ | 4.5 | 197 |
| Example 26 | ○ | ○ | 4 | 207 |
| Example 27 | ○ | ○ | 5 | 190 |
| Example 28 | ○ | ○ | 4.5 | 187 |
| Example 29 | ○ | ○ | 4.5 | 188 |
| Example 30 | ○ | ○ | 4 | 203 |
| Comparative Example 1 | ○ | X | 5.5 | 160 |
| Comparative Example 2 | Got cloudy right after mixing. | X | 0.5 | 183 |
| Comparative Example 3 | Caused gelling in about 10 days. | X | 0.5 | 186 |
| Comparative Example 4 | ○ | X | 5.5 | 158 |
| Comparative Example 5 | ○ | X | 5.5 | 170 |

The trade names shown in Tables 1 and 2 show the following compounds.

Epikote 828: A bisphenol A type epoxy resin produced by Yuka Shell Epoxy K. K.

ESCN-195XL: A cresol novolac type epoxy resin produced by Sumitomo Chemical Co., Ltd.

YDPN-638: A phenolic novolac type epoxy resin produced by Tohto Kasei Co., Ltd.

The formulations of Tables 1 and 2 contain the following compounds besides those shown in Tables 1 and 2.

In Examples 1 to 17

6.7 parts by weight of a curing agent (dicyandiamide) and 100.0 parts by weight of a solvent (DMF), per 100 parts by weight of epoxy resin.

In Examples 18 to 22

10.0 parts by weight of dicyandiamide and 100.0 parts by weight of DMF, per 100 parts by weight of epoxy resins.

In Examples 23 to 30

6.7 parts by weight of dicyandiamide, 0.1 part by weight of 2-methylimidazole (a product of Shikoku Chemicals Corp.) and 50 parts by weight of DMF, per 100 parts by weight of epoxy resin(s).

In Comparative Examples 1 to 4

100.0 parts by weight of DMF per 100 parts by weight of epoxy resin.

In Comparative Example 5

0.1 part by weight of 2-methylimidazole and 50 parts by weight of DMF per 100 parts by weight of epoxy resin.

In Table 3, the symbols have the following meanings.

Storage stability o: No change over 3 months or more.

Film formability o: There is neither resin tack nor resin cracking when bent.

x: There is resin tack or resin cracking when bent.

As is clear from the above Examples and Comparative Examples, the epoxy resin composition of the present invention is superior in storage stability, film formability, workability, heat resistance, etc., and is suitably used in electronic materials, for example, parts of electronic appliances such as printed wiring board and the like.

What is claimed is:

1. An epoxy resin composition comprising
   (1) an epoxy resin,
   (2) a polymer obtained by reacting a polycarbodiimide with a compound having, in the molecule, at least one group reactive with carbodiimide group, between the carbodiimide group of said polycarbodiimide and the group reactive with carbodiimide group, of said compound, said compound being selected from the group consisting of a compound having at least one amide group in the molecule but having no active hydrogen other than the amide group and a compound having at least one phenolic hydroxyl group in the molecule but having neither active hydrogen other than the phenolic hydroxyl group nor carbon-to-carbon unsaturated bond other than aromatic ring-constituting carbon-to carbon unsaturated bond, and
   (3) a curing agent for epoxy resin other than the polymer (2).

2. The epoxy resin compound according to claim 1, wherein the polycarbodiimide has an average polymerization degree of 3 to 200.

3. The epoxy resin according to claim 1, wherein the polymer obtained by reacting a polycarbodiimide with a compound having, in the molecule, at least one group reactive with carbodiimide group, between the carbodiimide group of said polycarbodiimide and the group reactive with carbodiimide group, of said compound, is a polymer obtained by reacting a polycarbodiimide with a compound having, in the molecule, at least one group reactive with carbodiimide group, between the carbodiimide group of said polycarbodiimide and the group reactive with carbodiimide group, of said compound in an equivalent ratio (between the two kinds of groups) of 10:1 to 10:50.

4. The epoxy resin composition according to claim 1, wherein the polymer obtained by reacting a polycarbodiimide with a compound having, in the molecule, at least one group reactive with carbodiimide group, between the carbodiimide group of said polycarbodiimide and the group reactive with carbodiimide group, of said compound, is contained in an amount of 1 to 500 parts by weight per 100 parts by weight of the epoxy resin.

5. The epoxy resin composition according to claim 1, wherein said curing agent is contained in an amount of 0.1 to 1.2 equivalents per equivalent of the epoxy resin.

* * * * *